United States Patent
Ra

(10) Patent No.: US 6,480,018 B2
(45) Date of Patent: Nov. 12, 2002

(54) CHARGE GAIN STRESS TEST CIRCUIT FOR NONVOLATILE MEMORY AND TEST METHOD USING THE SAME

(75) Inventor: Kyeong-Man Ra, Choongcheongbuk-Do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/973,087

(22) Filed: Oct. 10, 2001

(65) Prior Publication Data

US 2002/0063571 A1 May 30, 2002

Related U.S. Application Data

(62) Division of application No. 09/291,309, filed on Apr. 15, 1999, now Pat. No. 6,323,671.

(30) Foreign Application Priority Data

Dec. 15, 1998 (KR) .......................... 55124/1998

(51) Int. Cl.[7] .............................. G01R 31/26
(52) U.S. Cl. ..................................... 324/765; 324/158.1
(58) Field of Search ........................... 365/185.12, 201; 324/765, 158.1, 719, 760, 769, 522

(56) References Cited

U.S. PATENT DOCUMENTS 5,428,570 A * 6/1995 Iwahashi ............... 365/185.12
5,745,412 A 4/1998 Choi .......................... 365/185

* cited by examiner

*Primary Examiner*—N. Le
*Assistant Examiner*—Vincent Q. Nguyen
(74) *Attorney, Agent, or Firm*—Fleshner & Kim, LLP

(57) ABSTRACT

A charge gain stress test circuit for a nonvolatile memory and a test method using the same according to the present invention allow a maximum size of a voltage used for a stress lower than a voltage applied in a normal operation. The preferred embodiment sufficiently increases an absolute value of an applicable stress voltage by using a reference current to control a stress voltage value without burdening the peripheral circuits. The preferred embodiment optimizes a stress time, namely the test time.

13 Claims, 2 Drawing Sheets

$V_G$ : VOLTAGE APPLIED TO GATE OF FLASH MEMORY
$I_{er}$ : CELL CURRENT AFTER ERASING
$I_{st}$ : CELL CURRENT AFTER APPLYING STRESS VOLTAGE($V_{pps}$)

$V_G$ : VOLTAGE APPLIED TO FLASH MEMORY
$I_{in}$ : CELL CURRENT BEFORE APPLYING STRESS VOLTAGE($V_{pps}$)
$I_{st}$ : CELL CURRENT AFTER APPLYING STRESS VOLTAGE($V_{pps}$)

$V_G$ : VOLTAGE APPLIED TO GATE OF FLASH MEMORY
$I_{er}$ : CELL CURRENT AFTER ERASING
$I_{st}$ : CELL CURRENT AFTER APPLYING STRESS VOLTAGE($V_{pps}$)

CHARGE GAIN STRESS TEST CIRCUIT FOR NONVOLATILE MEMORY AND TEST METHOD USING THE SAME

This application is a Divisional of application Ser. No. 09/291,309 filed Apr. 15, 1999 now U.S. Pat. No. 6,323,671.

BACKGROUND OF THE INVENTION

1. Field of the Invention

The present invention relates to a memory device, and more particularly, a charge gain stress test (CGST) circuit for a memory device and a test method using the same.

2. Background of the Related Art

Generally, a CGST circuit tests an inflow of unwanted electrons to a floating gate through a tunnel oxide for memory devices, such as nonvolatile memories including a flash memory. A ground source voltage VSS is applied to the source and drain, e.g., of a flash memory cell and then a voltage (a stress voltage) higher than an operating voltage is applied for a predetermined time to a gate. The high voltage applied to the gate is inversely proportional to the time for applying the stress. Thus, when the voltage is high, the stress time is shorter compared to when the voltage is low, where the stress time is longer.

FIG. 1 illustrates a related CGST circuit for a flash memory. A reference current generating unit 1 generates a reference current Iref, and a sense amp 2 outputs a compare result SOUT by comparing the reference current Iref with a cell current Icell. A flash memory cell 3 includes a floating gate and a source, which is connected with a ground source voltage VSS. A first switch SW1 is controlled by a first control signal READ and selectively connects the drain to the sense amp 2 or the ground source voltage VSS and a second switch SW2 selectively connects the gate of the flash memory 3 to a stress voltage Vpps controlled by the first control signal READ, which is used for the stress application, or a read voltage Vppr used for reading a cell state.

In such a CGST circuit, the first switch SW1 connects the drain of the flash memory cell 3 with the sense amp 2 in accordance with the first control signal READ, and the second switch SW2 connects the gate of the flash memory cell 3 with the read voltage Vppr. The sense amp 2 compares the cell current Icell flowing into the flash memory cell 3 with the reference current Iref to thereby output the compare result SOUT. The output signal SOUT from the sense amp 2 could be "1" or "0" depending upon the design of the circuit. For example, when the cell current Icell is greater than the reference current Iref, the sense amp 2 may output "1" as the output signal SOUT based on the design of the circuit.

The first switch SW1 controlled by the first control signal READ connects the drain of the flash memory cell 3 to the ground source voltage VSS and the second switch SW2 applies the stress voltage Vpps to the gate of the flash memory cell 3 for thereby applying the stress thereto for a predetermined period of time. After applying the stress for the predetermined period of time, the first switch SW1 connects the drain of the flash memory cell 3 to the sense amp 2, and the second switch SW2 connects the gate of the flash memory cell 3 to the read voltage Vppr.

If the flash memory cell 3 has an inferior characteristic, and thus electric electrons flow excessively into the floating gate due to the stress, the sense amp 2 outputs "0" because the cell current Icell is smaller than the reference current Iref. If the volume of the electrons flowing into the floating gate is very small, the sense amp 2 outputs "1" because the cell current Icell is still greater than the reference current Iref. If the output signal SOUT from the sense amp 2 is "0" according to such a CGST test, the cell is determined to be in a weak condition.

If directly testing a unit cell by an external device, it is necessary to consider the size of the voltage applied to gate, drain and source. However, in case of making and operating an array by using a circuit installing cells, the size of the voltage applied to each terminal is limited by characteristics of devices and peripheral circuits. In other words, the characteristics of the peripheral circuit and the devices limit the maximum applicable size of the voltage.

Accordingly, since the time for applying the stress is inversely proportional to the applied voltage, there is a limit to reduce the time for applying the stress. When having a chip constituting the nonvolatile memory cell as the array, since there occurs the limitation to the maximum applicable voltage due to the characteristics of the peripheral circuit and the devices, the stress application time, namely the test time, can not be reduced below a specific time, which results in a longer test time. In addition, since the voltage applied to the stress is considerably higher than the operating voltage in the normal operation, a serious burden is placed upon the peripheral circuit unit.

SUMMARY OF THE INVENTION

An object of the present invention is to obviate the problems and disadvantages of the background art and other related art.

Another object of the present invention is to optimize the stress time.

Another object of the present invention is to remove the burden of peripheral circuits during the stress test.

Still another object of the present invention is to allow a maximum size of a voltage used for a stress lower than a voltage applied in a normal operation.

A further object of the present invention is to sufficiently increase an absolute value of an applicable stress voltage by using a reference current.

To achieve these and other advantages and in accordance with the purpose of the present invention, as embodied and broadly described, there is provided a circuit for performing a charge gain stress test for a nonvolatile memory which includes a reference current generating unit for generating a reference current, a sense amp for comparing a cell current with the reference current and outputting a compare result, a first switch controlled by a first control signal and thus selectively connecting the sense amp or a first voltage to a drain of a nonvolatile memory cell, a second switch controlled by the first control signal and thus selectively connecting the first voltage or a second voltage to a gate of the nonvolatile memory cell, or controlled by a second control signal and thus selectively connecting the first voltage or a third voltage to the gate of the nonvolatile memory cell, and a third switch controlled by the- second control signal and for thus selectively connecting the first voltage or a fourth voltage to a source of the nonvolatile memory cell.

The present invention can be achieved in whole or in parts by a circuit for performing a charge gain stress test for a nonvolatile memory, comprising a reference current generator that generates a reference current; a comparator that compares a cell current with the reference current and outputting a compare result; a first switch controlled by a first control signal to selectively connect the comparator or a first voltage to a drain of a nonvolatile memory cell; a second switch controlled by the first control signal to selectively connect the first voltage or a second voltage to a gate of the nonvolatile memory cell, or controlled by a second control signal to selectively connect the first voltage or a third voltage to the gate of the nonvolatile memory cell; and a third switch controlled by the second control signal to selectively connect the first voltage or a fourth voltage to a source of the nonvolatile memory cell.

The present invention can be achieved in a whole or in parts by a method of performing a charge gain stress test for a nonvolatile memory, comprising the steps of setting a reference current inputted to a sense amp at a predetermined value; repeating erasing and reading operations; applying a stress voltage for a predetermined time; and evaluating a characteristic of a nonvolatile memory cell.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
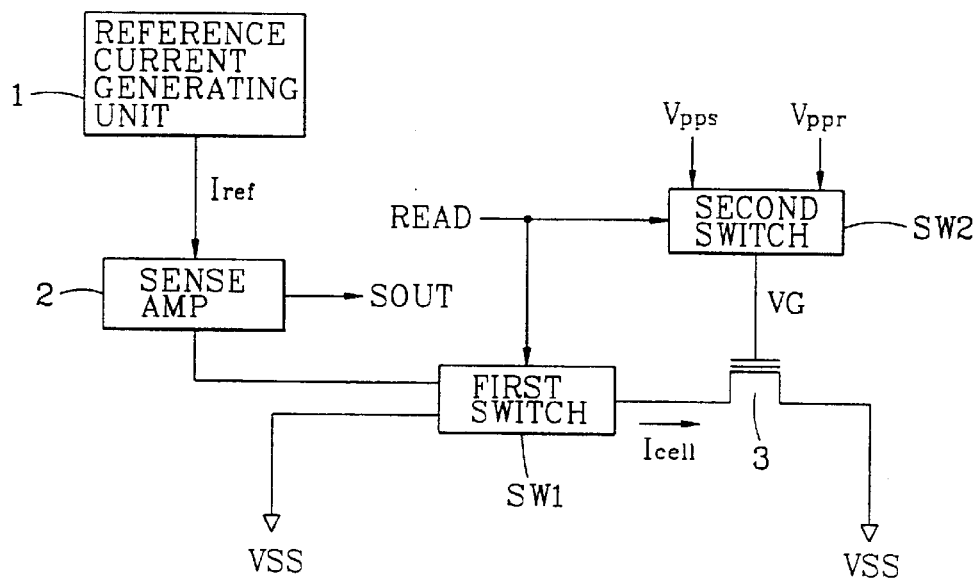
FIG. 1 is a circuit diagram of a CGST circuit of a flash memory in the background art.
Figure 2:
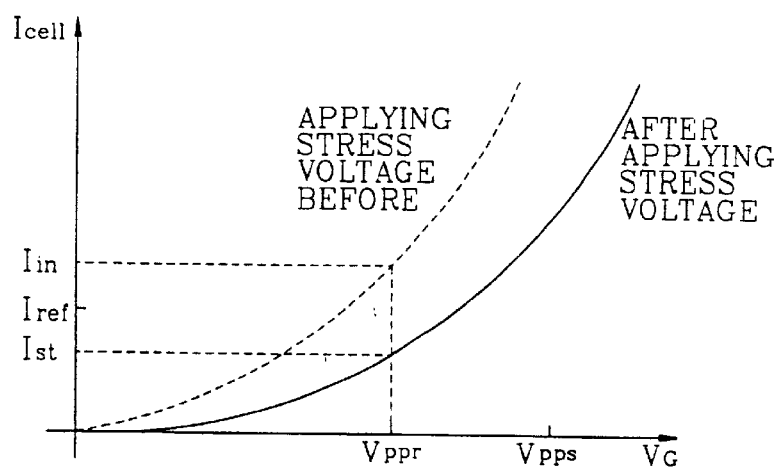
FIG. 2 is a graph illustrating a characteristic of a flash memory cell of the CGST circuit illustrated in FIG. 1.
Figure 3:
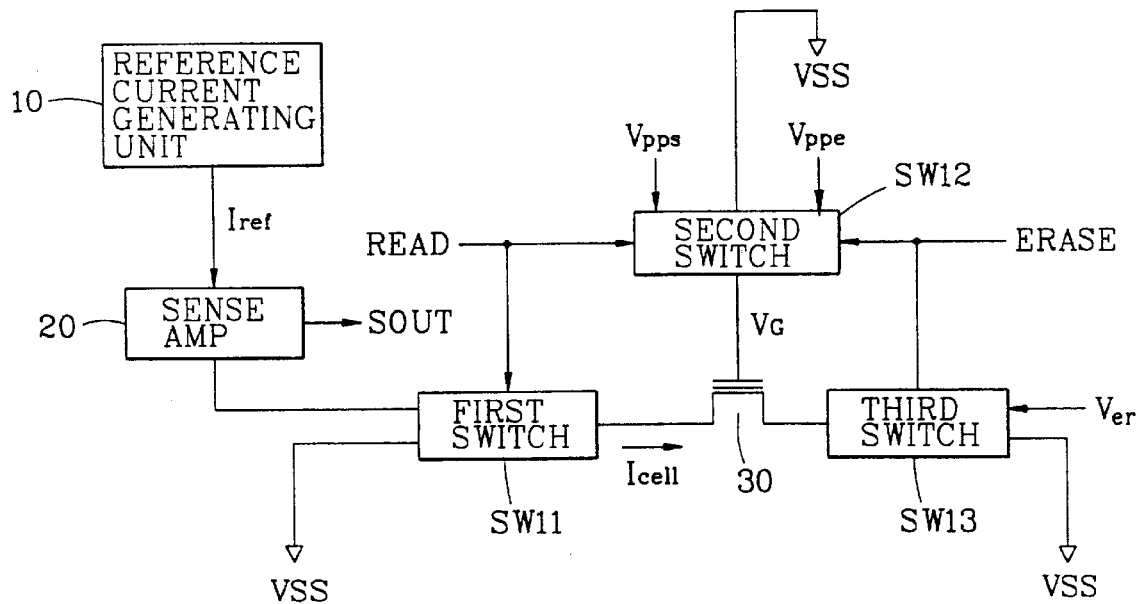
FIG. 3 is a circuit diagram of a CGST circuit of a flash memory in accordance with a preferred embodiment of the present invention.

FIG. 3 illustrates a CGST circuit of a flash memory according to a preferred embodiment of the present invention. A reference current generating unit 10 generates a reference current Iref, and a sense amp 20 outputs a compare result SOUT by comparing the reference current Iref with a cell current Icell. A first switch SW11 is controlled by a first control signal READ to connect the sense amp 20 or a ground source voltage VSS to a drain of the flash memory cell 30. A second switch SW12 is controlled by the first control signal READ for selectively connecting the ground source voltage VSS or a stress voltage Vpps to a gate of the flash memory cell 30, or is controlled by a second control signal ERASE for thereby controlling the ground source voltage VSS or a first erase voltage to the gate of the flash memory cell 30. A third switch SW13 is controlled by the second control signal ERASE for selectively connecting the ground source voltage VSS or a second erase voltage Ver to a source of the flash memory cell 30.

The first erase voltage Vppe is the ground source voltage VSS or a negative voltage. The second erase voltage Ver has a positive voltage when the first erase voltage Vppe is a ground source voltage VSS, and has a ground source voltage VSS or positive voltage when the first erase voltage Vppe is a negative voltage.

In such a CGST circuit, the first switch SW11 connects the drain of the flash memory cell 30 with the sense amp 20 in accordance with the first control signal READ. The second switch SW12 connects the gate of the flash memory cell 30 with the ground source voltage VSS in accordance with the first and second control signals READ and ERASE. The third switch SW13 connects the source of the flash memory 30 to the ground source voltage VSS in accordance with the second control signal ERASE.

The sense amp 20 compares the reference current Iref with the cell current Icell for thereby outputting the compare result output SOUT. The output signal SOUT from the sense amp 20 can be "1" or "0" according to the design of a circuit. In the preferred embodiment of the present invention, the circuit is designed such that when the cell current Icell is greater than the reference current Iref, the sense amp 20 outputs "1" as the output signal SOUT. Therefore, if an initial threshold voltage of the flash memory cell 30 is greater than the ground source voltage VSS, the sense amp 20 outputs "0" because the cell current Icell is smaller than the reference current Iref.

Figure 4:
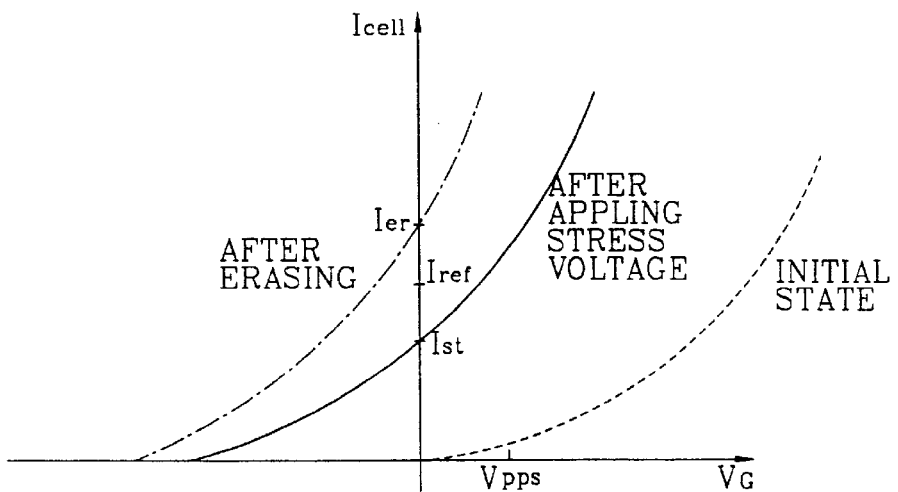
FIG. 4 is a graph illustrating a characteristic of a flash memory cell of the CGST circuit illustated in FIG. 3.

If the reference current Iref is set to be high as illustrated in FIG. 4, the third switch SW13 applies the second erase voltage Ver to the source of the flash memory cell 30 in accordance with the second control signal ERASE, the second switch SW12 applies the first erase voltage Vppe to the gate of the flash memory cell 30, and the drain of the flash memory cell 30 erases the data thereof stored in the floating gate. Until the cell current Icell flowing into the flash memory cell 30 becomes higher than the reference current Iref, i.e., until the logic of the output SOUT from the sense amp 20 becomes "1", the erasing and reading operations are repeatedly performed.

The size of the reference current Iref is determined by the maximum value of the stress voltage Vpps, as shown in FIG. 4. Consequently, the characteristic of the flash memory cell 30 is tested by using the sense amp 20 after applying the stress voltage Vpps for a predetermined time. The principle of the CGST circuit of the flash memory according to the present invention is to over erase the flash memory cell 30 and have positive electric charges flowed to the floating gate. Due to the electric charges of the floating gate, an absolute value of the externally applied voltage (the stress voltage Vpps) decreases. In other words, the voltage which is a potential difference between the floating gate is necessary for the stress test and source/gate is externally applied through the stress voltage Vpps in the conventional art. In the present invention, since a predetermined voltage is made in the floating gate and a voltage portion to be required is externally applied, the absolute value of the externally applied voltage becomes considerably low.

The CGST circuit according to a preferred embodiment of the present invention has an advantage of having the maximum size of the voltage used for the stress lower than the voltage applied in the normal operation. In addition, since it is possible to sufficiently increase the absolute value of the applicable stress voltage by using the reference current and thus the stress voltage value can be controlled without burdening the peripheral circuits, the stress time, namely the test time can be optimized.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method of performing a charge gain stress test for a nonvolatile memory, comprising:

setting a reference current inputted to a sense amplifier at a predetermined value;

repeating erasing and reading operations to over erase the nonvolatile memory to a predetermined voltage level;

applying a stress voltage to a gate of the selected nonvolatile memory cell for a predetermined time; and evaluating a characteristic of a nonvolatile memory cell.

2. The method of claim 1, wherein a size of the reference current is set in accordance with a maximum value of a stress voltage.

3. The method of claim 1, wherein the step of the erasing and reading operations are repeated until a cell current after the erasing operation becomes higher than the reference current.

4. The method of claim 1, further comprising connecting the sense amplifier to a drain of a selected nonvolatile memory cell and a voltage to a source of the selected nonvolatile memory cell.

5. The method of claim 1, further comprises controlling the connection of the sense amplifier and the drain of the selected nonvolatile memory cell by a first control signal.

6. The method of claim 1, further comprises controlling the application of the stress voltage to the gate of the selected nonvolatile memory cell by a first control signal.

7. The method of claim 1, further comprises controlling the connection of the voltage and the source of the selected nonvolatile memory cell by a second control signal.

8. The method of claim 1, wherein the voltage is used for erasing data of the nonvolatile memory cell.

9. The method of claim 1, wherein the nonvolatile memory cell is a flash memory cell.

10. The method of claim 1, wherein the erasing and reading operations apply a first and a second erase voltages to the nonvolatile memory.

11. The method of claim 10, wherein the first erase voltage is a ground source voltage or a negative voltage.

12. The method of claim 10, wherein the second erase voltage is a positive voltage when the first erase voltage is a ground source voltage.

13. The method of claim 10, wherein the second erase voltage is a ground source voltage or a positive voltage when the first erase voltage is a negative voltage.

* * * * *